United States Patent

[11] 3,622,384

[72] Inventors Norman Davey; Geoffrey Roger Loasby, both of Newbury, England

[21] Appl. No. 854,934
[22] Filed Sept. 3, 1969
[45] Patented Nov. 23, 1971
[73] Assignee National Research Development Corporation London, England
[32] Priorities Sept. 5, 1968
[33] Great Britain
[31] 42,380/68;
Sept. 5, 1968, Great Britain, No. 42,381/68

[54] MICROELECTRONIC CIRCUITS AND PROCESSES FOR MAKING THEM
12 Claims, 7 Drawing Figs.

[52] U.S. Cl. .......... 117/212, 29/625, 117/215, 174/68.5
[51] Int. Cl. .......... B44d 1/18, B44d 1/14
[50] Field of Search .......... 117/212, 215, 38; 29/625; 174/68.5

[56] References Cited

UNITED STATES PATENTS

| | | | |
|---|---|---|---|
| 2,692,321 | 10/1954 | Hicks | 117/212 X |
| 3,169,892 | 2/1965 | Lemelson | 117/212 X |
| 3,317,653 | 5/1967 | Layer, Jr. et al. | 117/212 X |
| 3,374,110 | 3/1968 | Miller | 117/212 |
| 3,391,454 | 7/1968 | Reimann et al. | 29/625 |
| 3,434,877 | 3/1969 | Degenkolb et al. | 117/212 |
| 3,513,022 | 5/1970 | Casterline et al. | 117/212 |

*Primary Examiner*—Alfred L. Leavitt
*Assistant Examiner*—Alan Grimaldi
*Attorney*—Cushman, Darby & Cushman

ABSTRACT: In a process for making a multilayer microelectronic circuit by successive screen-printing operations, at least one layer of the circuit is formed by screen printing a first conductor pattern of conductor material and a first insulating pattern of insulating material, the insulating pattern being substantially complementary to the conductor pattern so that inked areas of the insulating pattern adjoin but do not overlap inked areas of the conductor pattern and together the conductor pattern and the insulator pattern present a substantially flat surface for receiving further screen-printed patterns to form the microelectronic circuit. A second insulating layer may be formed with a pattern of apertures where through-connections to the first conductor pattern are required, and these apertures filled with conductive material and a second conductor pattern printed over the second insulating layer in a single operation. An aperture may be provided in every pattern of every layer to form a recess in which a semiconductor chip can be mounted.

Figure 1:
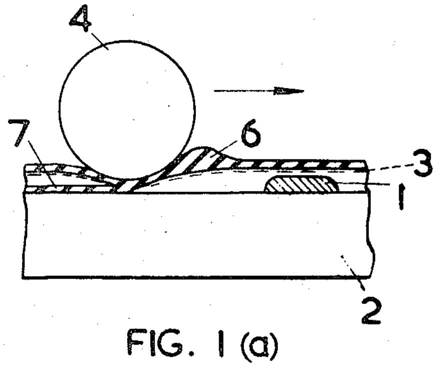

Norman Davey
Roger J. Loasby
*Inventors*

By
Cushman, Darby & Cushman
*Attorneys*

MICROELECTRONIC CIRCUITS AND PROCESSES FOR MAKING THEM

The present invention relates to microelectronic circuits, and particularly to multilayer microelectronic circuits and processes for making them.

It is known to form a microelectronic circuit by screen-printing a conductive ink pattern on an insulating substrate. It is also known to deposit an insulating layer over such a pattern by screen-printing with an insulating or dielectric ink, and to build up a multilayer microelectronic circuit by screen-printing conductive patterns and insulating layers alternately. Connections between the patterns in different layers may be made by extending the inked lines of the patterns to areas not covered by the dielectric layers.

However, it is found that the electrical characteristics of screen-printed structures may be critically affected by the clearance provided between the screen of the screen-printing apparatus and the surface on which the ink is printed, and by the pressure applied in the printing. To achieve close tolerances and good reproducibility of electrical characteristics it is necessary to make the clearance and the applied pressure constant over all parts of the printed patterns, and this requires a very smooth and flat substrate. The printed conductor lines of each pattern layer have a thickness which, though it is small, is appreciable in comparison with clearances commonly used in the screen-printing of conductor patterns. The formation of a conductive pattern therefore presents a significantly uneven, nonplanar surface for the screen-printing of subsequent layers, and the layers subsequently screen-printed tend to be thinner where they cross any line of the underlying inked pattern. Where a multilayer circuit is to be built up with several superimposed conductor patterns, the uneveness or nonflatness produced by the patterns is cumulative, so that the tendency to form thin areas is increased in the upper layers.

This tendency to form thin areas is highly undesirable, as it tends to affect the electrical characteristics, and may make the circuits unreliable. A thin area in an insulating layer will reduce its breakdown voltage and increase its capacitance. A thin area in a superimposed conductor line will increase its electrical resistance. In extreme cases it might overheat in operation or become an open circuit.

It is an object of the present invention to provide multilayer screen-printed microelectronic circuits, and a process for making them, in which the above-described tendency for the formation of thin areas is considerably reduced or avoided.

According to the present invention in one aspect thereof, in a process for manufacturing a microelectronic circuit a conductor pattern and an insulating pattern are screen-printed in successive operations, the insulating pattern being substantially complementary to the conductor pattern, so that inked areas of the insulating pattern adjoin but do not overlap inked areas of the conductor pattern, and together the insulating pattern and the conductor pattern present a substantially flat surface for receiving further screen-printed patterns to form the microelectronic circuit.

According to the present invention in another aspect thereof, there is provided a microelectronic circuit comprising at least three layers superimposed on a substrate, of which at least one layer is formed of a screen-printed conductor pattern and a screen-printed insulating pattern, the said screen-printed insulating pattern being substantially complementary to the said screen-printed conductor pattern so that inked areas of the insulating pattern adjoin but do not overlap inked areas of the conductor pattern and together the said insulating pattern and the said conductor pattern provide a substantially flat surface on which upper layers of the circuit are screen-printed.

A typical embodiment of the invention may comprise an insulating substrate having a substantially flat surface, a first network or conductor pattern of a conductive material and a first insulating pattern of an insulating material both formed on the said substantially flat surface so that the conductor pattern forms boundaries of the insulating pattern and together they form a substantially flat surface, a layer of an insulating material of substantially uniform thickness formed on and extending over the said first conductor pattern and the said insulating pattern but leaving some portions of the said first conductor pattern exposed, and a second network or conductor pattern of a conductor material formed on the said layer and also extended to make connection with the said exposed portions of the said first conductor pattern. The said layer may be formed with a pattern of apertures in it, each aperture being positioned where a connection from the first conductor pattern to the second conductor pattern is required and a conductor material may be deposited in the said apertures to form the required interlayer connections.

Where it is desired to attach a device formed on a semiconductor chip to the circuit, an aperture may be provided in every pattern and every layer deposited, so as to form a recess in which the chip may be located, in faceup attitude with its contact areas exposed. Connections to the chip can then be made by bonding short connection wires to the contact areas of the chip and to exposed contact areas of a conductor pattern in the top layer of the circuit.

It is usual in the art to give each screen-printed layer a heat treatment to drive off the solvent or screen-printing medium used and to stabilize the printed insulating or conductor material before superimposing the next layer. In the case of the insulating material, the ink usually includes finely powdered particles of a low-melting glaze which is fused by the heat treatment. However, fusion of the glaze must not be allowed to cause any significant distortion of the circuit patterns. With ordinary glazes a very accurate control of the heat-treatment temperature is required to avoid distortions, and it is practically impossible, or at least very difficult, to maintain the accuracy of an insulating pattern during the heat treatment. However, it is possible and not unduly difficult to maintain the accurate insulating patterns required in the present invention during satisfactory stabilizing heat treatments, if a suitable insulator material of the kind described in copending U.S. Pat. application No. 775,404 is used. The use of insulator material of this kind also enables a reasonable tolerance on the heat-treatment temperature to be allowed.

The above-mentioned insulator material of U.S. Pat. application 775,404 comprises a glaze composition intermixed with a proportion of particles of a refractory oxide sufficient to make the fluidity of the material considerably less than the fluidity of the glaze composition by itself, over a range of temperatures extending from the temperature at which fusion of the glaze composition begins towards higher temperatures. The particles are preferably of an oxide which will diffuse, but not melt, into the glaze composition when it is melted and will thereby tend to raise the fusion temperature of the glaze composition during prolonged or successive heat treatments at temperatures sufficient to cause fusion of the glaze composition. The refractory oxide particles may include one or more of the oxides alumina, beryllia, zirconia, calcium oxide or magnesium oxide of natural or synthetic origin, and may preferably constitute from 10 to 40 percent of the insulator material, as disclosed and claimed in the aforesaid copending patent application. The glaze composition used may be made of any glass or mixture of glasses which is compatible with the oxide particles used, and on which the diffusion of the oxide will act as hereinbefore described. The insulator material will be mixed with a suitable screen-printing medium, probably an organic carrier liquid which can be removed by heat treatment, to form a printable ink. The particles of glaze and oxide must of course be sufficiently fine to pass through the screen of the screen-printing apparatus, and may typically have diameters in the range from 2 to 30 microns.

As previously noted, the proportion of oxide particles used may preferably be in the range from 10 to 40 percent by weight. Obviously, very small proportions of the oxide particles may have insufficient effect to allow a reasonable tolerance on the heat treatment temperatures. High proportions of oxide particles may undesirably increase the fusion temperature needed to fuse the glaze.

Figure 2:
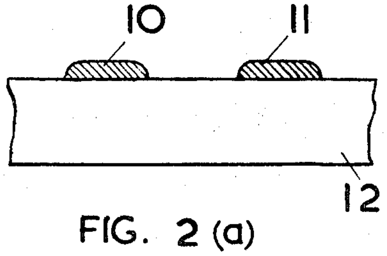
Figure 1:
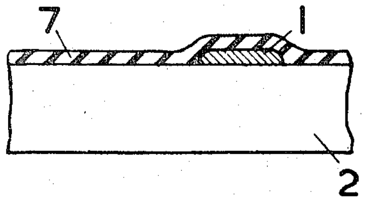
Figure 2:
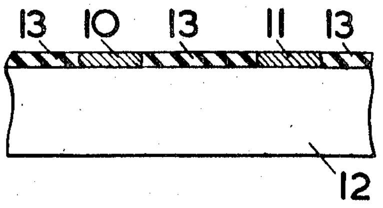
Figure 1:
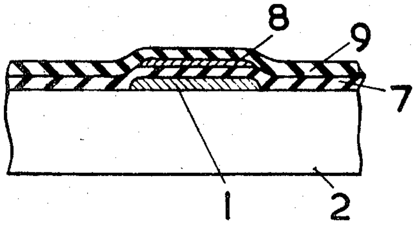
Figure 2:
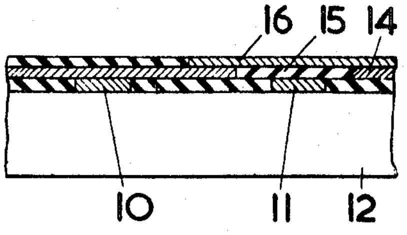
Figure 3:
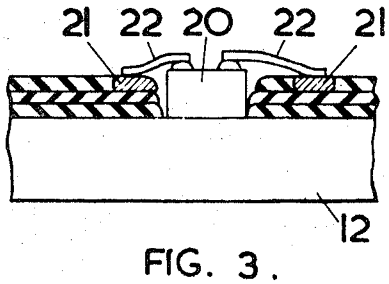

Embodiments of the invention and its advantages will now be further described with reference to the accompanying drawings, of which:

FIGS. 1(*a*), 1(*b*) and 1(*c*) are diagrammatic sections representing stages in the formation of part of a microelectronic circuit according to conventional processes of the prior art;

FIGS. 2(*a*), 2(*b*) and 2(*c*) are diagrammatic sections representing stages in the formation of part of a microelectronic circuit by the present invention; and FIG. 3 is a diagrammatic section showing the mounting of a semiconductor chip in part of a microelectronic circuit forming an embodiment of the present invention.

These drawings are not to scale, and the features shown thereon are exaggerated for the sake of clarity; in particular the thickness of the printed layers is considerably exaggerated.

FIG. 1(*a*) shows in section a conductor 1 which forms part of a first conductor pattern printed on a ceramic substrate 2, and illustrates diagrammatically the screen-printing of an insulating layer over it as practiced in the prior art. The dotted line 3 represents the screen of a screen-printing apparatus, and the circle 4 represents the cross section of a roller or squeegee, which is pressed against the screen 3 and drawn across it from left to right in the drawing as indicated by the arrow 5, to force some ink 6 through the screen 3 onto the substrate 2 to form an insulating layer 7 extending as required over the conductor pattern. FIG. 1(*b*) shows the completed layer 7 after printing.

It is found that the amount of ink deposited is critically dependent on the clearance between the free position of the screen 3 and the surface receiving the print, and the pressure with which the roller 4 is pressed against the screen 3, as well as the consistency of the ink and other possible variables. The thickness of the conductor 1 tends to alter the clearance and possibly the pressure also when the roller passes over the conductor 1. As a result, the insulating layer 7 tends to be thinner than its nominal or intended thickness wherever it passes over a conductor, as shown in FIG. 1(*b*).

In a practical circuit, two or more conductor patterns with insulated crossovers will generally be required. Hence a second conductor pattern may be screen-printed over the insulating layer 7, and a second insulating layer and then a third conductor pattern may be added if necessary.

FIG. 1(*c*) represents a cross section taken diagonally through an insulated crossover where a conductor 8 of a second conductor pattern crosses over the conductor 1 of the first conductor pattern, being insulated from the conductor 1 by a thin area of the insulating layer 7. A second insulating layer 9 is shown, formed over the second conductor pattern. It will be readily recognized that the superimposition of the two conductors 1 and 8 at the crossover area causes a considerable variation in the screen-to-printing surface clearance and tends to cause a very substantial thinning of the second insulator layer 9 where it crosses the crossover area.

FIGS. 2(*a*), 2(*b*) and 2(*c*) show typical details of a construction in an embodiment of the present invention in which the above-described undesirable variations in thickness of the printed material are substantially avoided.

FIG. 2(*a*) shows two conductors 10 and 11 of a first conductor pattern printed on flat surface of a ceramic substrate 12, as in the prior art.

FIG. 2(*b*) shows parts 13 of an insulating pattern printed on the structure of FIG. 2(*a*). It should be noted that the insulating pattern is substantially complementary to the conductor pattern, so that the inked areas of the insulating pattern adjoin but do not overlap inked areas of the conductor pattern and together the insulating pattern and the conductor pattern present a substantially flat surface for further printing.

Further layers, each including a conductor pattern and an insulating pattern, or in some cases comprising merely an insulating layer which leaves some contact areas of the underlying conductor pattern exposed, may be formed by further printing on the structure of FIG. 2(*b*).

FIG. 2(*c*) shows part of a structure with three layers each comprising a conductor pattern and an insulating pattern. The left-hand side of this drawing exemplifies a typical detail where a connection is required between a conductor 14 in the second layer and the conductor 10 of the first layer. The right-hand side of FIG. 2(*c*) exemplifies a typical detail where an insulated crossover is required. On the left of the drawing, the required connection is simply formed by printing the conductor 14 over an exposed surface of the conductor 10 so as to make contact with it. On the right of the drawing, the conductor 11 in the first layer is covered by a part 15 of the insulating pattern of the second layer which interrupts the conductor 14. The two parts of the conductor 14 are connected by a bridgepiece 16 which forms part of the conductor pattern in the third layer.

Clearly, in some embodiments the insulating pattern of the second or any intermediate layer could form simply a sheet with a pattern of apertures where through-connections are desired, and it is possible to fill the small apertures required for these through-connections with conductive material and print the conductor pattern of the next layer in a single printing operation.

Devices formed on separate semiconductor chips may be mounted in the circuit as indicated in FIG. 3. An aperture or noninked area, is provided in every pattern of every layer. These areas, being aligned with each other, form a recess in which a chip can be mounted as shown in the drawing where reference 20 indicates the chip. The chip 20 may be merely placed in position, but it is preferably bonded to the substrate 12 by a suitable adhesive, for instance an epoxy resin, or by a gold alloy bond. Conductors 21 in the uppermost layer of the circuit are connected to contact areas on the upper surface of the chip 20 by short connection wires 22. The wires 22 are bonded to the conductors 21 and the contact areas of the chip by conventional thermocompression bonding.

Structures as illustrated in FIGS. 2 and 3 have been formed on alumina substrates 0.6-millimeter thick, on surfaces having a half-micron surface finish. The conductor patterns were printed with a gold metallizing paste known as Hanovia Paste Gold No. 8637, supplied by Engelhard Industries Ltd. After printing each pattern it was dried at 150° C. and heat treated at 850° C. for 10 minutes. The insulator material used was a mixture of 80 percent by weight of glaze powder and 20 percent by weight of alumina powder. The glaze powder was of a borosilicate glass, reference code 1362C, supplied by Blythe Colours Ltd. and the alumina powder, having a maximum particle size of 2 microns, was supplied by Sherman Chemicals Ltd. The glaze and alumina mixture was mixed with an equal volume of an inert liquid medium to form a paste suitable for use as a screen-printing ink. The medium used was supplied by Blythe Colours Ltd. as screen medium N485. After printing each insulator pattern was dried at 150° C. and then heat treated at 850° C. for 10 minutes. Each pattern was approximately 0.025-millimeter thick. Apertures for through-connections were made in the form of substantially rectangular windows approximately 0.25-millimeter wide and 0.6-millimeter long. Apertures 1.25-millimeters wide and 1.25-millimeters long were used to form recesses for semiconductor chips as shown in FIG. 3.

In a modification of the process hereinbefore described, the first to be printed of a pair of patterns forming one layer is merely dried, then the complementary pattern is printed, dried and inspected, and then both patterns are given the appropriate heat treatment (850° C. for 10 minutes in the case of the materials hereinbefore specified) in a single operation.

The required heat-treatment temperature and time will naturally depend on the particular materials used.

I claim:

1. A process for manufacturing a microelectronic circuit wherein a conductor pattern and an insulating pattern are screen-printed in separate operations, the insulating pattern being substantially complementary to the conductor pattern so that inked areas of the insulating pattern adjoin but do not overlap inked areas of the conductor pattern, and together the insulating pattern and the conductor pattern present a substantially flat surface for receiving further screen-printed patterns to form the microelectronic circuit.

2. A process for manufacturing a microelectronic circuit which comprises the operations of preparing an insulating substrate having a smooth flat surface, screen-printing a first conductor pattern of conductive material on said smooth flat surface, drying and heat treating said first conductor pattern to stabilize it, screen-printing a first insulating pattern of insulating material on said surface, said first insulating pattern being substantially complementary to said first conductor pattern so that inked areas of said first insulating pattern adjoin but do not overlap inked areas of said first conductor pattern, and together the said first conductor pattern and the said first insulating pattern form a first layer of the circuit presenting a substantially flat surface, drying and heat treating said first insulating pattern to stabilize it, and performing further screen-printing, drying and heat-treatment operations sequentially to build up, over said first conductor pattern and said first insulating pattern, further circuit layers comprising further conductor patterns and further insulating patterns, having interconnections as required to form the microelectronic circuit.

3. A process for manufacturing a microelectronic circuit as claimed in claim 2 wherein the said further operations comprise screen-printing a second insulating pattern of insulating material over said first conductor pattern and said first insulating pattern, the said second insulating pattern having noninked apertures where through-connections to inked areas of the first conductor pattern are required, drying and heat treating said second insulating pattern to stabilize it, screen-printing a second conductor pattern of conductive material over said second insulating pattern, the said second conductor pattern having inked areas extending over the said noninked apertures of said second insulating pattern so that the ink printed therein will also fill said apertures and form the required through-connections to said first conductor pattern, and drying and heat treating said second conductor pattern to stabilize it.

4. A process as claimed in claim 2 and wherein the insulator material consists essentially of a glaze composition mixed with from about 10 to about 40 percent by weight of particles of one or more refractory oxides selected from the group comprising alumina, beryllia, zirconia, calcium oxide and magnesium oxide and a suitable screen-printing medium wherein the glaze composition consists of powdered glass or a mixture of powdered glasses which when fused together will be compatible with the refractory oxide particles used and into which the oxide of the refractory particles will diffuse when the glaze composition is melted, thereby tending to raise the fusion temperature of the glaze composition during prolonged or successive heat treatments at temperature sufficient to cause fusion of the glaze composition.

5. A process for manufacturing a microelectronic circuit which comprises the operations of preparing an insulating substrate having a smooth flat surface, screen-printing a first conductor pattern of conductive material on said smooth surface, drying said first conductor pattern, screen-printing a first insulating pattern of insulating material on said surface, said first insulating pattern being substantially complementary to said first conductor pattern so that inked areas of said first insulating pattern adjoin but do not overlap inked areas of said first conductor pattern, and together the said first conductor pattern and the said first insulating pattern form a first layer of the circuit presenting a substantially flat surface, drying said first insulating pattern and heat treating the assembly to stabilize said first conductor pattern and said first insulating pattern, and performing further screen-printing, drying and heat-treatment operations sequentially to build up, over said first conductor pattern and said first insulating pattern, further circuit layers comprising further conductor patterns and further insulating patterns as required to form the circuit.

6. A process as claimed in claim 5 and wherein the insulator material consists essentially of a glaze composition mixed with from about 10 to about 40 percent by weight of particles of one or more refractory oxides selected from the group comprising alumina, beryllia, zirconia, calcium oxide and magnesium oxide and a suitable screen-printing medium wherein the glaze composition consists of powdered glass or a mixture of powdered glasses which when fused together will be compatible with the refractory oxide particles used and into which the oxide of the refractory particles will diffuse when the glaze composition is melted, thereby tending to raise the fusion temperature of the glaze composition during prolonged or successive heat treatments at temperature sufficient to cause fusion of the glaze composition.

7. A microelectronic circuit comprising a substrate and at least three layers of material superimposed on said substrate, of which at least one of the said layers comprises a screen-printed conductor pattern of conductive material and a screen-printed insulating pattern of insulating material, the said screen-printed insulating pattern being substantially complementary to the said screen-printed conductor pattern, so that inked areas of the insulating pattern adjoin but do not overlap inked areas of the conductor pattern and together the said insulating pattern and the said conductor pattern provide a substantially flat surface on which upper layers of the circuit are screen-printed, and wherein the said insulating material consists essentially of a glaze composition mixed with from about 10 to about 40 percent by weight of particles of one or more refractory oxides selected from the group comprising alumina, beryllia, zirconia, calcium oxide and magnesium oxide, the said glaze composition being fused in situ and being composed of glassy material, compatible with the selected refractory oxides, into which the selected refractory oxide will diffuse when the glaze composition is fused thereby tending to increase the fusion temperature of the glaze composition during prolonged or successive heat treatments at temperatures sufficient to cause fusion of the glaze composition.

8. A microelectronic circuit as claimed in claim 7 and wherein at least one recess is formed by noninked areas in every pattern of every layer, a device formed on a semiconductor chip is located in said recess, and contact areas on said device are electrically connected to conductive contact areas in the uppermost layer of the circuit.

9. A microelectronic circuit comprising an insulating substrate having a substantially flat surface, a first conductor pattern of a conductive material and a first insulating pattern of an insulating material both formed on the said substantially flat surface so that the said conductor pattern forms boundaries of the said insulating pattern and together they form a substantially flat surface, a layer of an insulating material of substantially uniform thickness formed on and extending over said first conductor pattern and said first insulating pattern but leaving some portions of said first conductor pattern exposed, a second conductor pattern of a conductor material formed on the said layer of insulating material and also extended to make connection with said exposed portions of said first conductor pattern, wherein the insulating material of the said first insulating pattern and the said layer consists essentially of a glaze composition mixed with from about 10 to about 40 percent by weight of particles of one or more refractory oxides selected from the group comprising alumina, beryllia, zirconia, calcium oxide and magnesium oxide, the said glaze composition being fused in situ and being composed of glassy material, compatible with the selected refractory oxides, into which the selected refractory oxide will diffuse when the glaze composition is fused thereby tending to increase the fusion temperature of the glaze composition during prolonged or successive heat treatments at temperatures sufficient to cause fusion of the glaze composition.

10. A microelectronic circuit as claimed in claim 9 and wherein said layer of insulating material is formed with a pattern of noninked apertures in it, each aperture being filled with conductor material integral with the said second conductor pattern and making electrical contact to a part of said first conductor pattern.

11. A microelectronic circuit as claimed in claim 9 and wherein at least one recess is formed by noninked areas in every pattern of every layer, a device formed on a semiconductor chip is located in said recess, and contact areas on said device are electrically connected to conductive contact areas in the uppermost layer of the circuit.

12. A process for manufacturing a microelectronic circuit as claimed in claim 5 wherein the said further operations comprise screen-printing a second insulating pattern of insulating material over said first conductor pattern and said first insulating pattern, the said second insulating pattern having noninked apertures where through-connections to inked areas of the first conductor pattern are required, drying and heat treating said second insulating pattern to stabilize it, screen-printing a second conductor pattern of conductive material over said second insulating pattern, the said second conductor pattern having inked areas extending over the said noninked apertures of said second insulating pattern so that the ink printed therein will also fill said apertures and form the required through-connections to said first conductor pattern, and drying and heat treating said second conductor pattern to stabilize it.

* * * * *